US007632703B2

(12) United States Patent
Wu et al.

(10) Patent No.: US 7,632,703 B2

(45) Date of Patent: Dec. 15, 2009

(54) ORGANIC THIN-FILM TRANSISTORS

(75) Inventors: Yiliang Wu, Mississauga (CA); Beng S. Ong, Mississauga (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 576 days.

(21) Appl. No.: 11/315,785

(22) Filed: Dec. 22, 2005

(65) Prior Publication Data

US 2007/0148812 A1 Jun. 28, 2007

(51) Int. Cl.

*H01L 21/00* (2006.01)
*H01L 21/469* (2006.01)
*H01L 35/24* (2006.01)

(52) U.S. Cl. .............................. 438/96; 438/97; 438/99; 438/82; 438/149; 438/780; 257/40

(58) Field of Classification Search ................... 438/96, 438/97, 99, 82, 149, 780; 257/40
See application file for complete search history.

(56) References Cited

U.S. PATENT DOCUMENTS

| | | | | |
|---|---|---|---|---|
| 6,621,099 | B2 | 9/2003 | Ong et al. | |
| 6,740,900 | B2 * | 5/2004 | Hirai | 257/40 |
| 6,770,904 | B2 | 8/2004 | Ong et al. | |
| 6,774,393 | B2 | 8/2004 | Murti et al. | |
| 6,794,220 | B2 * | 9/2004 | Hirai et al. | 438/99 |
| 6,806,124 | B2 * | 10/2004 | Klauk et al. | 438/149 |
| 7,018,872 | B2 * | 3/2006 | Hirai et al. | 438/149 |
| 2003/0160234 | A1 | 8/2003 | Ong et al. | |

* cited by examiner

*Primary Examiner*—Howard Weiss
*Assistant Examiner*—Steven H Rao
(74) *Attorney, Agent, or Firm*—Fay Sharpe LLP

(57) ABSTRACT

Methods are disclosed for improving organic thin-film transistor (OTFT) performance by acid doping of the semiconducting layer. The semiconducting polymer comprising the semiconductor layer is doped with an acid, especially a Lewis acid, either during or after polymerization of the polymer, but prior to application of the polymer onto the OTFT. Also disclosed are OTFTs having enhanced charge carrier mobility produced by these methods.

7 Claims, 5 Drawing Sheets

ORGANIC THIN-FILM TRANSISTORS

This invention was made with United States Government support under Cooperative Agreement No. 70NANBOH3033 awarded by the National Institute of Standards and Technology (NIST). The United States Government has certain rights in the invention.

BACKGROUND

The present disclosure relates, in various embodiments, to methods for making a semiconductor layer for electronic devices, such as organic thin-film transistors ("OTFT"s), with increased charge carrier mobility through acid doping of the semiconductor layer. The present disclosure also relates to semiconductor layers produced using the methods and electronic devices containing such semiconductor layers having enhanced charge carrier mobility.

Thin film transistors (TFTs) are fundamental components in modern-age electronics, including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. OTFTs offer not only much lower manufacturing costs, but also appealing mechanical properties such as being physically compact, lightweight, and flexible.

OTFTs are generally composed of a supporting substrate, three electrically conductive electrodes (gate, source and drain electrodes), a channel semiconductor layer, and an electrically insulating gate dielectric layer separating the gate electrode from the source and drain electrodes. The channel semiconductor is in turn in contact with the source and drain electrodes. The materials used to make the OTFTs, and the interfacial properties between various layers of semiconductor, dielectric, and electrodes will affect the performance of the OTFTs. Accordingly, a great deal of recent effort has been devoted to improving the OTFT device performance through new semiconductor materials design, improvement of semiconductor ordering, and optimization of semiconductor and dielectric interface, etc. There is a further need for methods which will increase charge carrier mobility in the semiconductor layer.

BRIEF DESCRIPTION

The present disclosure is directed, in various embodiments, to increasing the charge carrier mobility of the semiconductor layer of an organic thin-film transistor. This can be accomplished by doping the semiconductor layer with appropriate dopants or dopant precursors.

In embodiments, a p-type semiconductor layer is doped with an acid to increase its charge carrier mobility. In specific embodiments, the p-type semiconductor layer is doped with a Lewis acid. In more specific embodiments, the p-type semiconductor layer is doped with $FeCl_3$.

The present disclosure also provides new methods for doping the semiconductor layer. In one embodiment, the semiconducting polymer used to form the semiconductor layer is doped during polymerization. In another embodiment, the semiconducting polymer is doped after polymerization. Carrier charge mobility is improved by a factor of about 3 to about 10 or more after doping depending on the method.

In other embodiments, the disclosure relates to a process for making an OTFT having an acid doped semi-conductive layer. The process comprises providing a monomer and an acid; polymerizing the monomer to form a semiconducting polymer; doping the semiconducting polymer with an acid to form an acid-doped semiconducting polymer; and applying the acid-doped semiconducting polymer to a component of an organic thin-film transistor to form an organic thin-film transistor having an acid-doped semiconducting layer. The resulting organic thin-film transistor exhibits enhanced charge carrier mobility.

In additional embodiments, the disclosure relates to a method for producing an organic thin-film transistor having an acid-doped semiconducting layer comprising providing a monomer and a Lewis-acid; polymerizing the monomer in the presence of the Lewis acid to form an acid-doped semiconducting polymer having a metal ion; and depositing the acid-doped semiconducting polymer onto a component of an organic thin-film transistor to form an organic thin-film transistor having an acid-doped semiconducting layer.

These and other non-limiting characteristics of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

FIG. 5(*b*) is a photomicrograph of the polymer of Example 2.

FIG. 6(*b*) is a mass spectrum of the polymer of Example 2.

DETAILED DESCRIPTION

Figure 1:
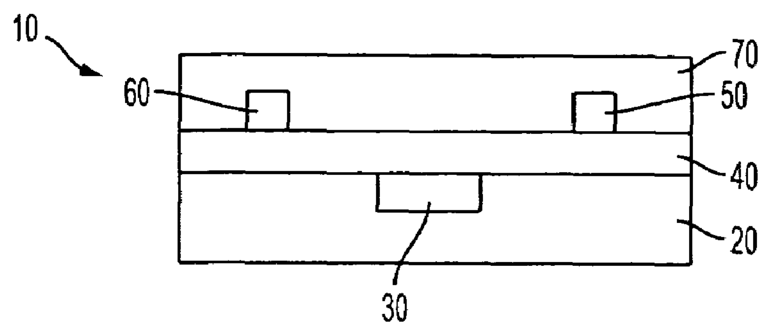
FIG. 1 is a first exemplary embodiment of an OTFT having the semiconductor layer of the present disclosure.

Methods are disclosed for improving organic thin-film transistor (OTFT) performance by acid doping of the semiconducting layer. The semiconducting polymer comprising the semiconductor layer is doped with an acid, especially a Lewis acid, either during or after polymerization of the polymer, but prior to application of the polymer onto the OTFT. Also disclosed are enhanced OTFTs produced by these methods.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIG. 1 illustrates a first OTFT configuration. The OTFT 10 comprises a substrate 20 in contact with the gate electrode 30 and a dielectric layer 40. Although here the gate electrode 30 is depicted within the substrate 20, this is not required; the key is that the dielectric layer 40 separates the gate electrode 30 from the source electrode 50, drain electrode 60, and the semiconductor layer 70. The source electrode 50 contacts the semiconductor layer 70. The drain electrode 60 also contacts the semiconductor layer 70. The semiconductor layer 70 runs over and between the source and drain electrodes 50 and 60.

Figure 2:
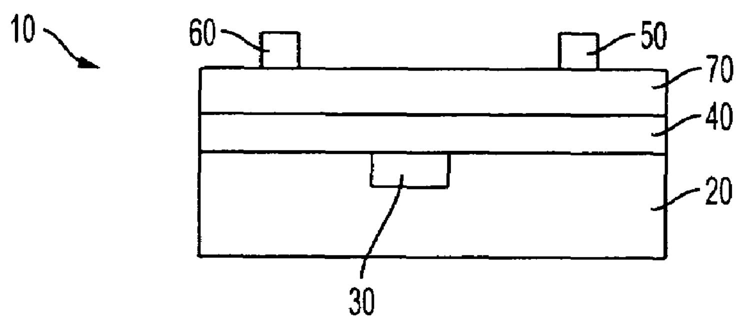
FIG. 2 is a second exemplary embodiment of an OTFT having the semiconductor layer of the present disclosure.

FIG. 2 illustrates a second OTFT configuration. The OTFT 10 comprises a substrate 20 in contact with the gate electrode 30 and a dielectric layer 40. The semiconductor layer 70 is placed on top of the dielectric layer 40 and separates it from the source and drain electrodes 50 and 60.

Figure 3:
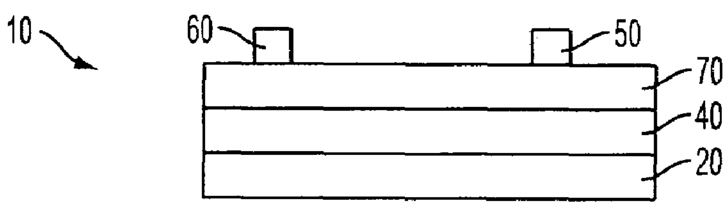
FIG. 3 is a third exemplary embodiment of an OTFT having the semiconductor layer of the present disclosure.

FIG. 3 illustrates a third OTFT configuration. The OTFT 10 comprises a substrate 20 which also acts as the gate electrode and is in contact with a dielectric layer 40. The semiconductor layer 70 is placed on top of the dielectric layer 40 and separates it from the source and drain electrodes 50 and 60.

Figure 4:
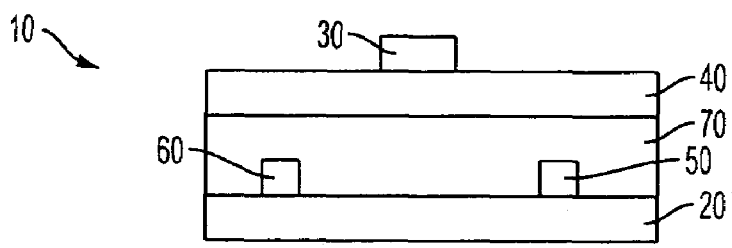
FIG. 4 is a fourth exemplary embodiment of an OTFT having the semiconductor layer of the present disclosure.

FIG. 4 illustrates a fourth OTFT configuration. The OTFT 100 comprises a substrate 20 in contact with the source electrode 50, drain electrode 60, and the semiconductor layer 70. The semiconductor layer 70 runs over and between the source and drain electrodes 50 and 60. The dielectric layer 40 is on top of the semiconductor layer 70. The gate electrode 30 is on top of the dielectric layer 40 and does not contact the semiconductor layer 70.

The semiconductor layer of the present disclosure is generally is an organic p-type semiconductor. Examples of organic semiconductors include but are not limited to acenes, such as anthracene, tetracene, pentacene, and their substituted derivatives, perylenes, fullerenes, oligothiophenes, polythiophenes and their substituted derivatives, phthalocyanines such as copper phthalocyanines or zinc phthalocyanines and their substituted derivatives. The semiconductor layer is from about 5 nm to about 1000 nm thick. The semiconductor layer can be formed by any suitable method. Exemplary deposition methods include molecular beam deposition, vacuum evaporation, sublimation, liquid deposition such as spin coating, dip coating, blade coating, rod coating, screen printing, stamping, ink jet printing, and the like, and other conventional processes known in the art.

In specific embodiments, the semiconductor is a p-type polymeric semiconductor. Exemplary semiconducting polymers include polythiophene, triarylamine polymers, polyindolocarbazoles, and the like. Polythiophenes include, for example, both regioregular and regiorandom poly(3-alkylthiophene)s, polythiophenes comprising substituted and unsubstituted thienylene groups, polythiophenes comprising optionally substituted thieno[3,2-b]thiophene and/or optionally substituted thieno[2,3-b]thiophene group, and polythiophenes comprising non-thiophene based aromatic groups such as phenylene, fluorene, furan, and the like. In further embodiments, the semiconducting polymer is a regioregular polythiophene.

For example, in one embodiment, a polythiophene, PQT 12, can be utilized. PQT 12 has the chemical structure shown below:

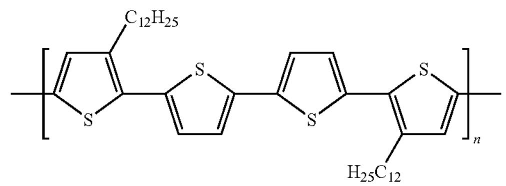

wherein n is the degree of polymerization and is usually from about 5 to about 5,000. See U.S. patent application Ser. No. 10/922,662, filed on Aug. 20, 2004, the disclosure of which is incorporated herein by reference in its entirety. Moreover, the synthesis of PQT via $FeCl_3$ oxidation is disclosed in U.S. application Ser. No 10/392,592, filed on Mar. 19, 2003, the disclosure of which is totally incorporated herein by reference.

The semiconducting polymer utilized in the present disclosure is doped with an acid dopant. In more particular embodiments, the dopant is a Lewis acid. In a specific embodiment, the Lewis acid is $FeCl_3$. Other suitable acids include $FeBr_3$, $Fe_2(SO_4)_3$, $MoCl_3$, $RuCl_3$, $Na_2S_2O_8$, $K_2S_2O_8$, $K_2Cr_2O_7$, $KMnO_4$, $KBrO_3$, $KClO_3$, and mixures thereof. The semiconducting polymer may also be doped with a dopant precursor which becomes an acid dopant during the manufacturing process. Exemplary dopant precursors include $Fe_2O_3$, which may be converted into $FeCl_3$ in situ by treatment with hydrochloric acid.

The semiconducting polymer can be doped either during or-after polymerization. In other words, the semiconducting polymer is doped prior to being applied to the OTFT either as the polymer is being formed or after the polymer is already formed. In one embodiment, the polymer is doped during polymerization. For example, a monomer is polymerized in the presence of a Lewis acid to form an acid-doped semiconducting polymer. The Lewis acid functions as a dopant and as a catalyst for polymerization. In another embodiment, the polymer is doped after polymerization. For example, two solutions are initially provided: 1) a first solution comprising the semiconducting polymer and 2) a second solution/dispersion comprising the Lewis acid. The second solution/dispersion is added to the first solution to form a combined composition. The polymer in the combined composition is thus doped with the Lewis acid. The combined composition can be optionally heated and/or agitated to accelerate the doping. In one embodiment, the combined solution is heated to a temperature of from about 40° C. to about 150° C., including from about 70° C. to about 90° C., and stirred for from about 1 minute to about 60 minutes, including from about 5 minutes to about 15 minutes. Before depositing the combined composition into a semiconductor layer, filtration is recommended. The Lewis acid may comprise from about 0.01 to about 1 weight percent of the semiconducting polymer, preferably from about 0.02 to about 0.5 weight percent of the semiconducting polymer.

The doping process results in the inclusion in the semiconducting polymer of some dopant. The dopant could be the original form of the acid or a reacted product of the dopant. For example, doping with a metal-containing Lewis acid results in the inclusion in the semiconducting polymer of a metal ion, such as Fe ion. In embodiments, the metal ion is present in an amount of from about 10 ppm to about 15,000 ppm of the semiconducting polymer when dried. In more specific embodiments, the metal ion is present in an amount of from about 10 ppm to about 10,000 ppm of the semiconducting polymer when dried.

The metal ion may be present in the form of metal oxides. The metal ion can also be present in the form of clusters of metal oxides such as $Fe_2O_3$ or FeO. Examples of other clusters of metal oxides include $Mo_2O_3$, MoO, $Ru_2O_3$, RuO, and the like. These clusters range in size from about 0.5 nm to about 50 nm in diameter, including from about 5 nm to about 15 nm in diameter. The clusters present in the semiconducting material produce enhanced charge carrier mobility. While not wanting to be limited to any particular theory, it is believed that the clusters produce enhanced charge carrier mobility as a result of their bridging effect. The metal ion, oxides, and clusters will also be present in the semiconducting layer formed from the doped semiconducting polymer.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite or silver colloids. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about 10-12 Siemens per centimeter (S/cm). The dielectric layer is formed using conventional processes known in the art, including those processes described in forming the gate electrode.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers.

The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

The various components of the OTFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconductor layer should both be in contact with the dielectric layer. In addition, the source and drain electrodes should both be in contact with the semiconductor layer. The semiconducting polymer formed by the methods of the present disclosure may be deposited onto any appropriate component of an organic thin-film transistor to form a semiconducting layer of that transistor.

The following examples illustrate an OTFT made according to the methods of the present disclosure. The examples are merely illustrative and are not intended to limit the present disclosure with regard to the materials, conditions, or process parameters set forth therein. All parts are percentages by weight unless otherwise indicated.

EXAMPLES

Comparative Example

Synthesis of 5,5'-bis(3-dodecyl-2-thienyl)-2,2'-dithiophene

A solution of 2-bromo-3-dodecylthiophene (11.5 grams, 34.92 mmol) in 40 milliliters of anhydrous tetrahydrofuran (THF) was added slowly over a period of 20 minutes to a mechanically stirred suspension of magnesium turnings (1.26 grams, 51.83 mmol) in 10 milliliters of THF in a 100 milliliter round-bottomed flask under an inert argon atmosphere. The resultant mixture was stirred at room temperature (about 22° C. to 25° C.) for 2 hours, and then at 50° C. for 20 minutes before cooling down to room temperature. The resultant mixture was then added via a cannula to a mixture of 5,5'-dibromo-2,2'-dithiophene (4.5 grams, 13.88 mmol) and [1,3-bis(diphenylphosphino]dichloronickel (II) (0.189 gram, 0.35 mmol) in 80 milliliters of anhydrous THF in a 250 milliliter round-bottomed flask under an inert atmosphere, and refluxed for 48 hours. Subsequently, the reaction mixture was diluted with 200 milliliters of ethyl acetate, washed twice with water and with a 5 percent aqueous hydrochloric acid (HCl) solution, and dried with anhydrous sodium sulfate. A dark brown syrup, obtained after evaporation of the solvent, was purified by column chromotography on silica gel yielding 5,5'-bis(3-dodecyl-2-thienyl)-2,2'-dithiophene as a yellow crystalline product in 55 percent yield, m.p. 58.9° C.

The NMR spectrum of the above obtained compound was recorded at room temperature using a Bruker DPX 300 NMR spectrometer:

$^1H$ NMR ($CDCl_3$): δ 7.18 (d, J=5.4 Hz, 2H), 7.13 (d, J=3.6 Hz, 2H), 7.02 (d, J=3.6 Hz, 2H), 6.94 (d, J=5.4 Hz, 2H), 2.78 (t, 4H), 1.65 (q, 1.65, 4H), 1.28 (bs, 36H), 0.88 (m, 6H).

Synthesis of 5,5'-bis(5-bromo-3-dodecyl-2-thienyl)-2,2'-dithiophene

N-bromo succinimide (1.68 grams, 9.44 mmol) was slowly added to a well-stirred solution of 5,5'-bis(3-dodecyl-2-thienyl)-2,2'-dithiophene (3.00 grams, 4.50 mmol) in a mixture of dichloromethane (40 milliliters) and acetic acid (20 milliliters) in a 250 milliliter round-bottomed flask. After the addition, the mixture was stirred at room temperature for 3 hours and monitored by monitored by thin layer chromatography. The crude solid product was collected by filtration and then washed with water and methanol. The product was further purified by recrystalization from a mixture of methanol and dichloromethane, giving 3.1 grams of 5,5'-bis(5-bromo-3-dodecyl-2-thienyl)-2,2'-dithiophene.

Synthesis of poly[5,5'-bis(3-dodecyl-2-thienyl)-2,2'-dithiophene]

A well stirred suspension of freshly prepared Reike Zn (0.174 gram, 2.67 mmol) in anhydrous THF (20 milliliters) under an inert atmosphere was added dropwise to a solution of 5,5'-bis(5-bromo-3-dodecyl-2-thienyl)-2,2'-dithiophene (2.0 grams, 2.42.mmol) in anhydrous THF (10 milliliters); The mixture was permitted to react for 45 minutes at room temperature. Subsequently, a suspension of [1,2-Bis(diphenylphosphinoethane)]dichloronickel(Ni(dppe)$Cl_2$) (0.021 gram, 0.04 mmol) in anhydrous THF (35 milliliters) was carefully added. The reaction mixture was heated at 60° C. for 24 hours and then poured into 2M hydrochloric acid solution in methanol. The precipitated polythiophene product was filtered, redissolved in 70 milliliters of hot THF, and precipitated from 2M ammonia solution in methanol. This procedure was repeated twice to remove the acid and oligomers. After drying in vacuum at room temperature, 0.9 grams of the semiconducting polymer was obtained.

Device Fabrication and Evaluation

A top-contact thin film transistor configuration as shown in FIG. 3 was produced. The test device comprised an n-doped silicon wafer with a thermally grown silicon oxide layer of a thickness of about 110 nanometers thereon. The wafer functioned as the gate electrode while the silicon oxide layer acted as the gate dielectric and had a capacitance of about 30 nF/cm$^2$ (nanofarads/sq. cm) as measured with a capacitor meter. The fabrication of the device was accomplished at ambient conditions without any precautions to exclude the materials and device from exposure to ambient oxygen, moisture, or light. The silicon wafer was first cleaned with argon plasma, isopropanol, air dried, and then immersed in a 0.1 M solution of octyltrichlorosilane in toluene for 20 minutes at 60° C. Subsequently, the wafer was washed with isopropanol and dried. The test semiconductor polythiophene layer (made as described above) of about 30 nanometers to 100 nanometers in thickness was then deposited on top of the silicon oxide dielectric layer by spin coating at a speed of 1,000 rpm for about 35 seconds, and dried in vacuum at 80° C. for 20 hours. The solution used in fabricating the semiconductor layer was comprised of 1 percent by weight of the polythiophene in an appropriate solvent such as chlorobenzene, and was filtered through a 0.45 μm filter before use. Thereafter, the gold source and drain electrodes were deposited on top of the semiconductor polythiophene layer by vacuum deposition through a shadow mask with various channel lengths and widths, thus creating a series of transistors of various dimensions.

The evaluation of field-effect transistor performance was accomplished in a black box at ambient conditions using a Keithley 4200 SCS semiconductor characterization system. The carrier mobility, μ, was calculated from the data in the saturated regime (gate voltage, VG<source-drain voltage, VD) according to equation (1)

$$I_{SD}=C_i\mu(W/2L)(V_G-V_T)^2 \quad (1)$$

where $I_{SD}$ is the drain current at the saturated regime, W is the semiconductor channel width, L is the semiconductor channel length, $C_i$ is the capacitance per unit area of the gate dielectric layer, and $V_G$ and $V_T$ are, respectively, the gate voltage and threshold voltage. The $V_T$ of the device was determined from the relationship between the square root of $I_{SD}$ at the saturated regime and $V_G$ of the device by extrapolating the measured data to $I_{SD}=0$.

Another property of a field-effect transistor is its current on/off ratio. This is the ratio of the saturation source-drain current when the gate voltage $V_G$ is equal to or greater than the drain voltage $V_D$ to the source-drain current when the gate voltage $V_G$ is zero. Using transistors with a dimension of W=5,000 μm and L=90 μm, the following average properties from at least five transistors were obtained:

Mobility: 0.007-0.01 cm$^2$V·s

On/off ratio: $10^6$

EXAMPLE 1

Doping the Semiconducting Polymer After Polymerization

The semiconducting polymer was the same polythiophene as used in the Control Example and was synthesized with the active zinc methods. However, after polymerization occurred and before being applied onto the OTFTs, the semiconducting polymer was doped with $FeCl_3$. The polymer was first dissolved in dichlorobenzene at a concentration of 0.5 percent by weight. Then $FeCl_3$ dissolved in dichlorobenzene was added into above solution. The total $FeCl_3$ was 0.2 percent of the polymer by weight of the polymer. The solution was then heated to about 80° C. and stirred for about 10 min. After cooling down to room temperature, the solution was filtrated with a 1.0 micrometer syringe filter before being spin coated onto the silicon substrate.

Device Fabrication and Evaluation

Top contact devices were fabricated as described in the Control Example except that the doped semiconducting polymer described above was used. Using transistors with dimensions of W=5,000 μm and L=90 μm, the following average properties from at least five transistors were obtained:

Mobility: 0.02-0.035 cm$^2$/V·s

On/off ratio: $10^6$

By the addition of trace amounts of $FeCl_3$, the carrier charge mobility was improved by a factor of 3 without a reduction in the current on/off ratio.

EXAMPLE 2

Doping the Semiconducting Polymer During Polymerization

The monomer, 5,5'-bis(3-dodecyl-2-thienyl)-2,2'-dithiophene, was synthesized using the same procedure as described in the Control Example. The polymerization of 5,5'-bis(3-dodecyl-2-thienyl)-2,2'-dithiophene was achieved by the $FeCl_3$-mediated oxidative coupling reaction as follows:

A solution of 5,5'-bis(3-dodecyl-2-thienyl)-2,2'-dithiophene (0.50 gram, 0.75 mmol) in 7 milliliters of chloroform was added slowly over a period of about 10 minutes to a well stirred mixture of $FeCl_3$ (0.40 gram, 2.47 mmol) in 3 milliliters of chloroform in a 50 milliliter round-bottomed flask in a dry atmosphere. The resultant mixture was heated at 50° C. for 1 hour, then 40° C. for 24 hours under a blanket of dry air. After the polymerization, the mixture was diluted with 20 milliliters of toluene and washed three times with water. The separated organic phase was stirred with 200 milliliters of 7.5 percent of an aqueous ammonia solution for half an hour, washed three times with water, and then poured into methanol to precipitate the crude polythiophene product. The latter was purified by soxhlet extraction with methanol, hexane, and chlorobenzene, Mw 27,300; Mn 16,900 relative to polystyrene standards.

Confirmation of Doping

Figure 5A:
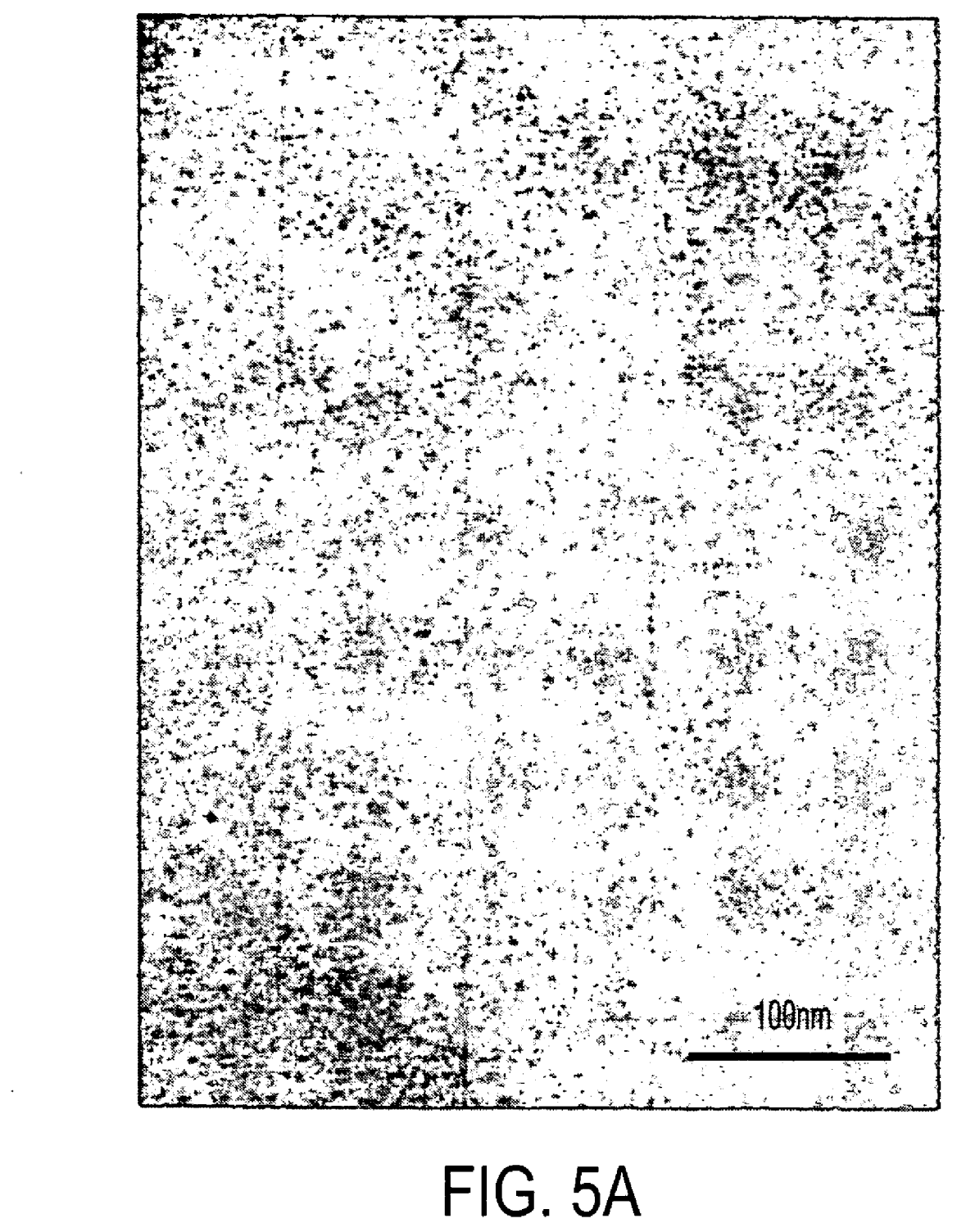
Figure 5B:
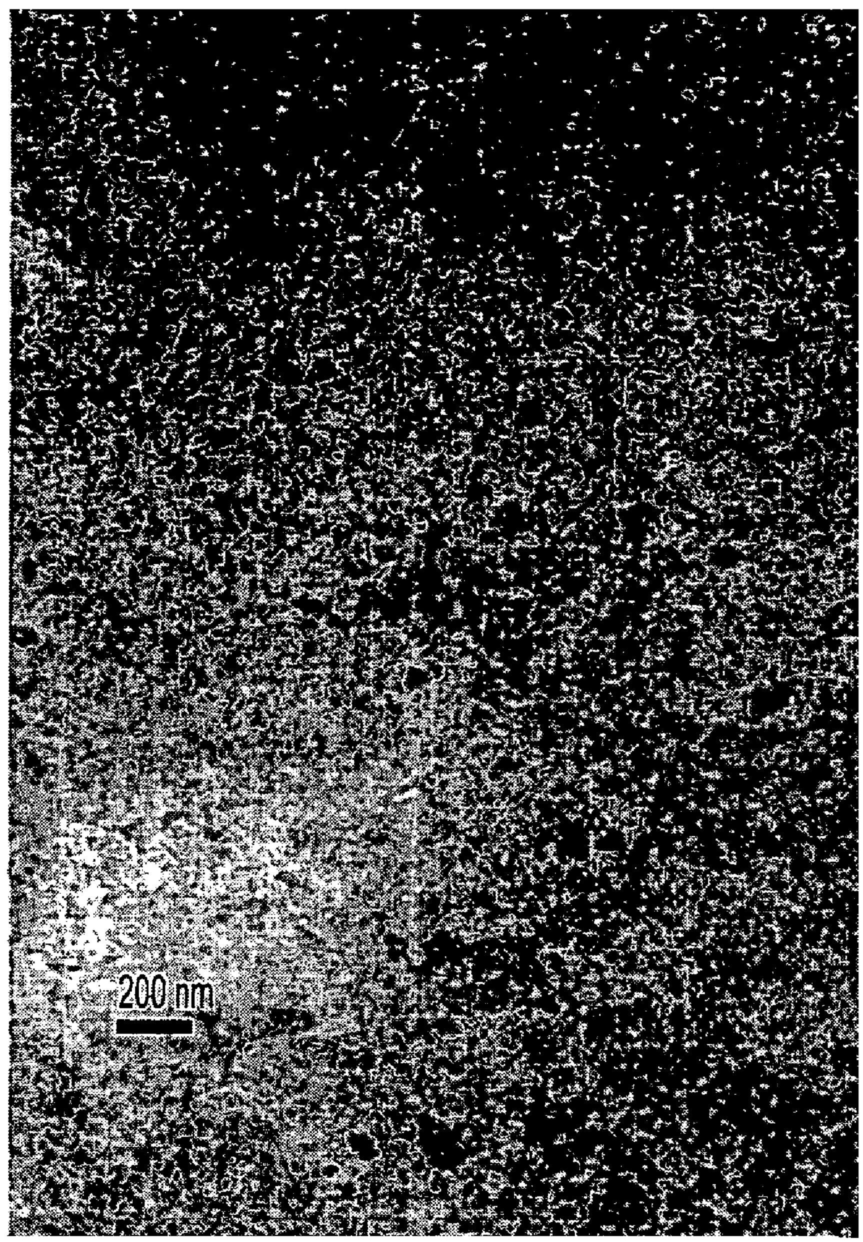
FIG. 5(*a*) is a photomicrograph of the polymer of the Comparative Example.
Figure 6A:
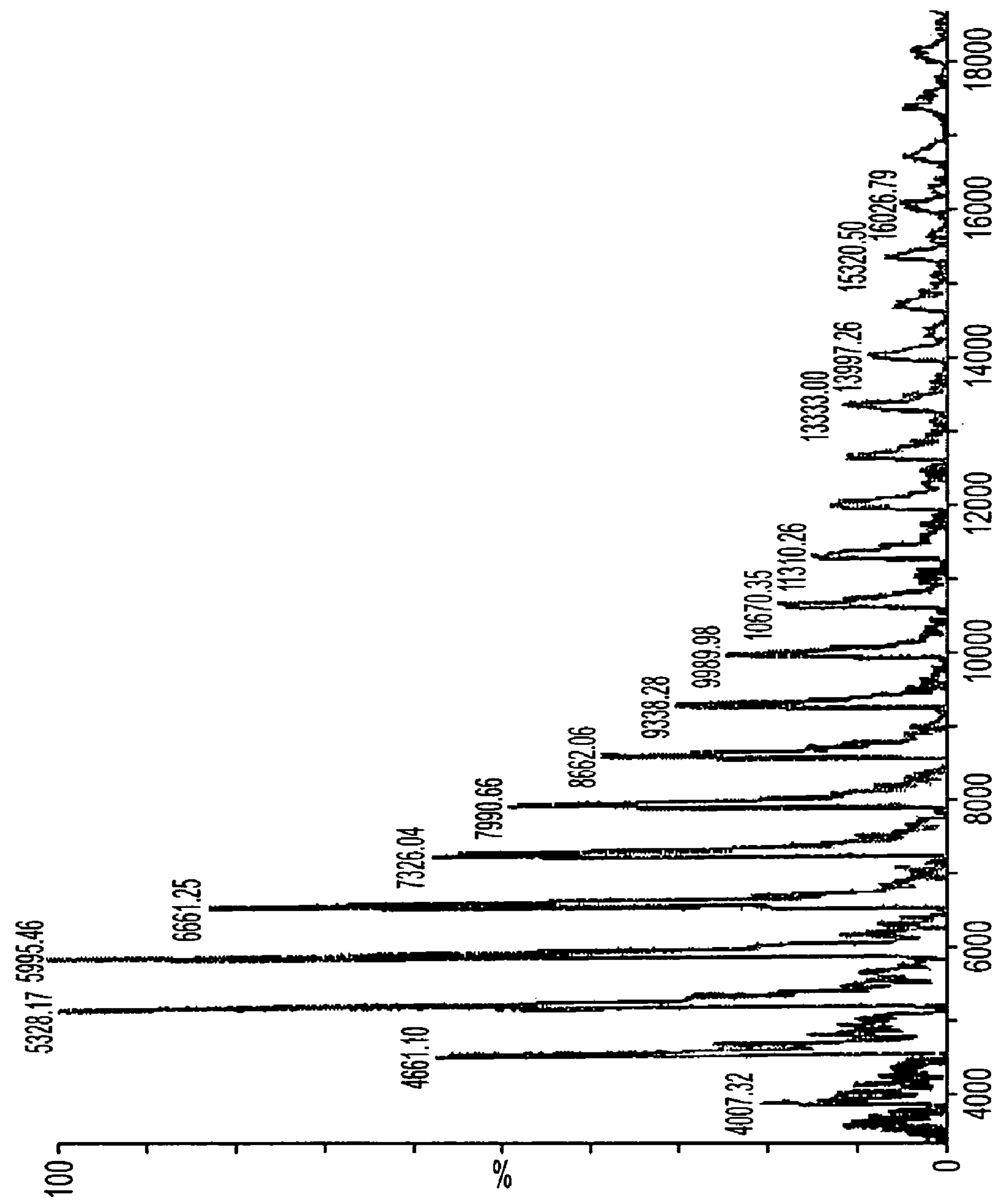
FIG. 6(*a*) is a mass spectrum of the polymer of the Comparative Example.
Figure 6B:
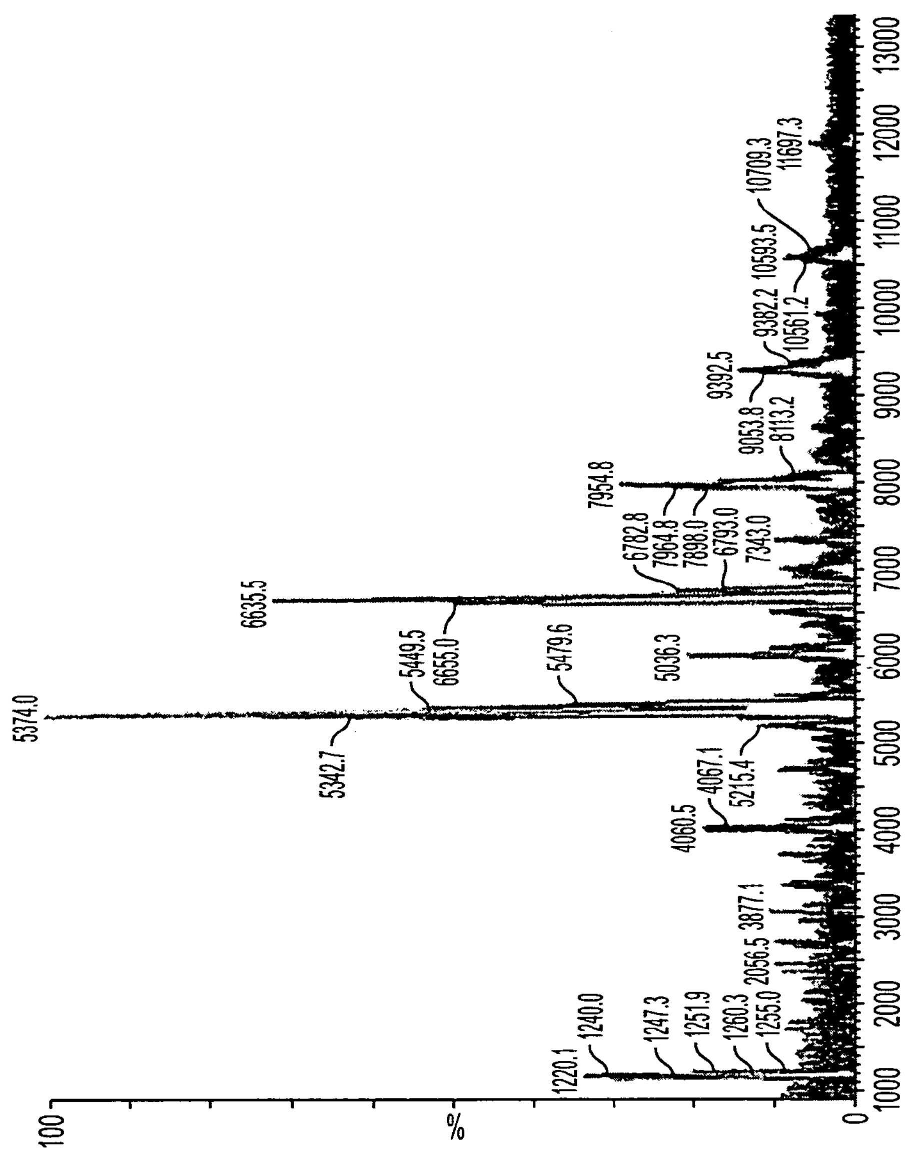

First, the existence of Fe ions was confirmed by ICP measurements. Residual iron in the polymer after purification was determined by ICP to be 0.3-0.5 wt %. Second, the presence of Fe ion clusters was directly observed with Energy Filtered Transmission Electron Microscope (EFTEM). As seen in the photomicrograph of FIG. 5(*a*), the polymer of the Comparative Example contains no clusters. However, Fe ion clusters (i.e., clusters of $Fe_2O_3$) of from about 0.5 nm to about 50 nm were seen in the polymer of Example 2, as seen in FIG. 5(*b*). These Fe ion clusters produce enhanced charge mobility. In addition, polymers synthesized by the methods of the present disclosure had a predominantly even number of repeating units compared to the polymer of the Comparative Example. This difference can be seen by comparing the mass spectra of FIGS. 6(*a*) and 6(*b*).

Device Fabrication and Evaluation

Top contact devices were fabricated as described in the Control Example, except that the semiconducting polymer synthesized as described above was used. The devices were further annealed at 140° C. for 10-30 min. Using transistors with dimensions of W=5,000 μm and L=90 μm, the following average properties from at least five transistors were obtained:

Mobility: 0.07-0.14 $cm^2/V \cdot s$

On/off ratio: $10^7$

By using this doping method, the carrier charge mobility was improved by a factor of about 10 compared to the Control Example.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A method for making an organic thin-film transistor having an acid-doped semiconducting layer with enhanced charge carrier mobility, comprising:

providing a monomer and a metal ion-containing acid;

polymerizing the monomer to form a semiconducting polymer;

doping the semiconducting polymer with the acid to form an acid-doped semiconducting polymer; and depositing the acid-doped semiconducting polymer onto a component of an organic thin-film transistor to form an organic thin-film transistor having an acid-doped semiconducting layer, the semiconducting layer containing from about 10 ppm to about 15,000 ppm of the metal ion.

2. The method of claim 1, wherein the step of doping the semiconducting polymer occurs after the step of polymerizing the monomer.

3. The method of claim 1, wherein the step of doping the semiconducting polymer occurs simultaneously with the step of polymerizing the monomer with the acid.

4. The method of claim 1, wherein the acid is a Lewis acid.

5. The method of claim 1, wherein the semiconducting polymer is a polythiophene.

6. The method of claim 4, wherein the acid is selected from the group consisting of $FeCl_3$, $FeBr_3$, $Fe_2(SO_4)_3$, $MoCl_3$, $RuCl_3$, $Na_2S_2O_8$, $K_2S_2O_8$, $K_2Cr_2O_7$, $kMnO_4$, $KBrO_3$, $KClO_3$, and mixtures thereof.

7. The organic thin-film transistor produced by the method of claim 1.

* * * * *

UNITED STATES PATENT AND TRADEMARK OFFICE

CERTIFICATE OF CORRECTION

PATENT NO. : 7,632,703 B2
APPLICATION NO. : 11/315785
DATED : December 15, 2009
INVENTOR(S) : Yiliang Wu et al.

It is certified that error appears in the above-identified patent and that said Letters Patent is hereby corrected as shown below:

In the Specifications:

Column 1, line 4, after "Cooperative Agreement No.", please delete "70NANBOH3033" and insert --70NANB0H3033--.

Signed and Sealed this
Third Day of September, 2013

Teresa Stanek Rea
*Acting Director of the United States Patent and Trademark Office*